US009837572B2

(12) United States Patent
Momozaki et al.

(10) Patent No.: US 9,837,572 B2
(45) Date of Patent: Dec. 5, 2017

(54) SOLAR CELL MODULE AND METHOD OF MANUFACTURING THEREOF

(75) Inventors: Aya Momozaki, Tsukuba (JP); Shigeki Katogi, Hitachi (JP); Hiroki Hayashi, Tsukuba (JP); Michiko Natori, Tsukuba (JP); Shinichirou Sukata, Tsukuba (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 456 days.

(21) Appl. No.: 13/981,540

(22) PCT Filed: Jan. 11, 2012

(86) PCT No.: PCT/JP2012/050376
§ 371 (c)(1),
(2), (4) Date: Sep. 13, 2013

(87) PCT Pub. No.: WO2012/102080
PCT Pub. Date: Aug. 2, 2012

(65) Prior Publication Data
US 2013/0340813 A1 Dec. 26, 2013

(30) Foreign Application Priority Data
Jan. 27, 2011 (JP) .................................. 2011-015631

(51) Int. Cl.
| H01L 31/18 | (2006.01) |
| H01L 31/0224 | (2006.01) |
| B32B 17/10 | (2006.01) |
| H01B 1/22 | (2006.01) |
| H01L 31/048 | (2014.01) |
| H01L 31/05 | (2014.01) |
| H01B 1/02 | (2006.01) |
| H01L 23/00 | (2006.01) |

(52) U.S. Cl.
CPC ........ *H01L 31/18* (2013.01); *B32B 17/10018* (2013.01); *B32B 17/10091* (2013.01); *B32B 17/10788* (2013.01); *B32B 17/10807* (2013.01); *H01B 1/02* (2013.01); *H01B 1/026* (2013.01); *H01B 1/22* (2013.01); *H01L 31/022425* (2013.01); *H01L 31/048* (2013.01); *H01L 31/0512* (2013.01); *H01L 24/26* (2013.01); *H01L 24/28* (2013.01); *H01L 24/29* (2013.01); *H01L 24/30* (2013.01); *Y02E 10/50* (2013.01)

(58) Field of Classification Search
CPC . H01L 31/18; H01L 31/022425; H01L 24/26; H01L 24/28–24/30
See application file for complete search history.

(56) References Cited

U.S. PATENT DOCUMENTS

| 5,074,928 A * | 12/1991 | Sanji .................. B23K 35/3618 |
| | | 148/23 |
| 5,439,164 A * | 8/1995 | Hasegawa .............. B23K 20/16 |
| | | 228/194 |
| 2008/0053571 A1 | 3/2008 | Yamamoto et al. |
| 2008/0121265 A1* | 5/2008 | Hishida ............. H01L 31/02242 |
| | | 136/244 |
| 2010/0155964 A1* | 6/2010 | Katsurayama et al. ...... 257/777 |
| 2011/0049439 A1* | 3/2011 | Higuchi ................... H01B 1/22 |
| | | 252/512 |

FOREIGN PATENT DOCUMENTS

| JP | 2001345465 A | 12/2001 | |
| JP | 2002-263880 A | 9/2002 | |
| JP | 2004-204256 A | 7/2004 | |
| JP | 2004-260131 | 9/2004 | |
| JP | 2005-243935 A | 9/2005 | |
| JP | 2008-135654 | 6/2008 | |
| JP | 2008-150597 A | 7/2008 | |
| JP | WO 2009069273 A1 * | 6/2009 | ............... H01B 1/22 |
| JP | 2009-295940 | 12/2009 | |
| KR | WO 2011102659 A2 * | 8/2011 | ......... B23K 35/0244 |
| WO | WO 2007/125650 A1 | 11/2007 | |
| WO | WO 2009/063841 | 5/2009 | |

OTHER PUBLICATIONS

International Search Report from Japanese Patent Office in counterpart International Application No. PCT/JP2012/050376, dated Feb. 14, 2012, pp. 1-2.
Notification of Transmittal of the International Preliminary Report on Patentability; and Written Opinion from International Bureau of WIPO in counterpart International Application No. PCT/JP2012/050376, dated Aug. 8, 2013, 2 pages; and Feb. 14, 2012, 6 pages, respectively.
Office Action in counterpart JP Appln. No. 2012-554714 dated Jan. 12, 2016.
Office Action in counterpart TW Appln. No. 101101074 dated Jun. 1, 2016.

(Continued)

*Primary Examiner* — David Zarneke
(74) *Attorney, Agent, or Firm* — Fitch, Even, Tabin & Flannery, LLP

(57) ABSTRACT

Provided is a method of manufacturing a solar cell module including: a step (A) of applying a conductive adhesive composition comprising conductive particles having metal, or the like; a step (B) of disposing wiring members so as to face with electrodes of the solar battery cells with the applied conductive adhesive composition interposed therebetween; a step (C) of heating the solar battery cells with the wiring members obtained in the step (B); and a step (D) of laminating sealing resins onto both surfaces of the solar battery cells with the wiring members obtained in the step (C), laminating protection glass onto a light-receiving surface of the solar battery cell and a protection film onto a rear surface of the solar battery cell, and performing heating, in which a melting point of the metal in the conductive particles is or lower than the heating temperature in the step (C).

7 Claims, 5 Drawing Sheets

(56) References Cited

OTHER PUBLICATIONS

Office Action in counterpart JP Appln. No. 2012-554714 dated May 31, 2016.

* cited by examiner

*Fig.2*
(a)
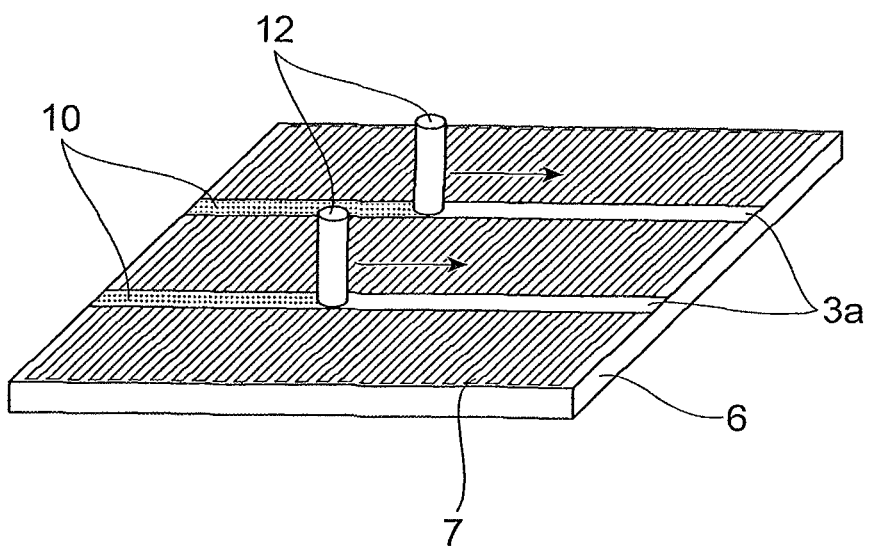
(b)
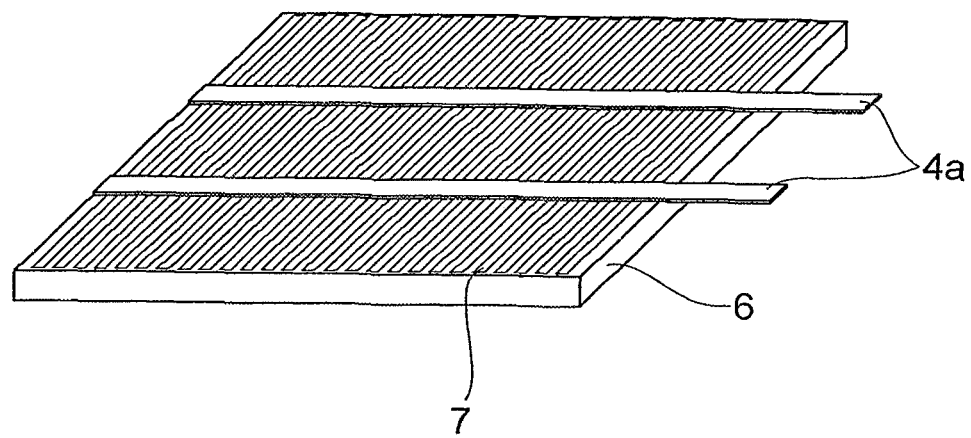

*Fig.3*
(a)
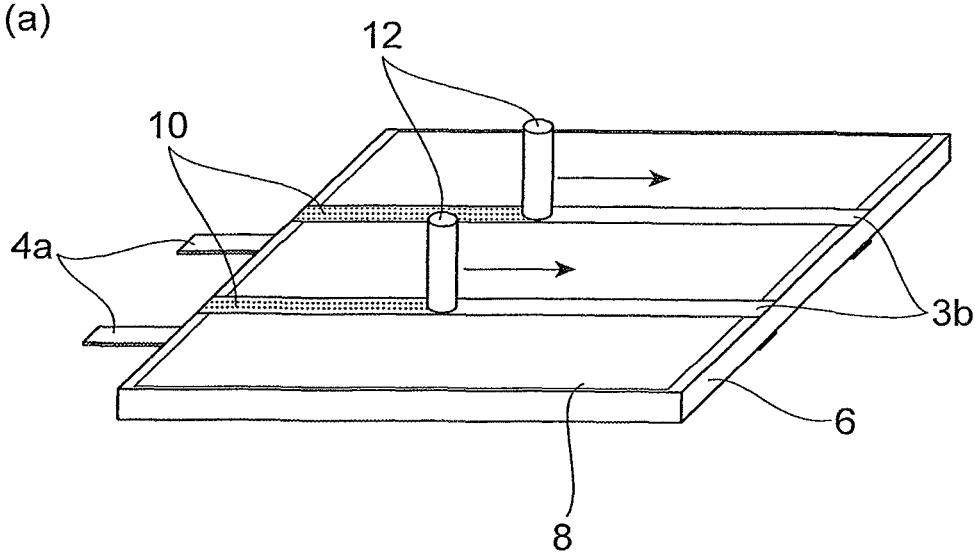
(b)
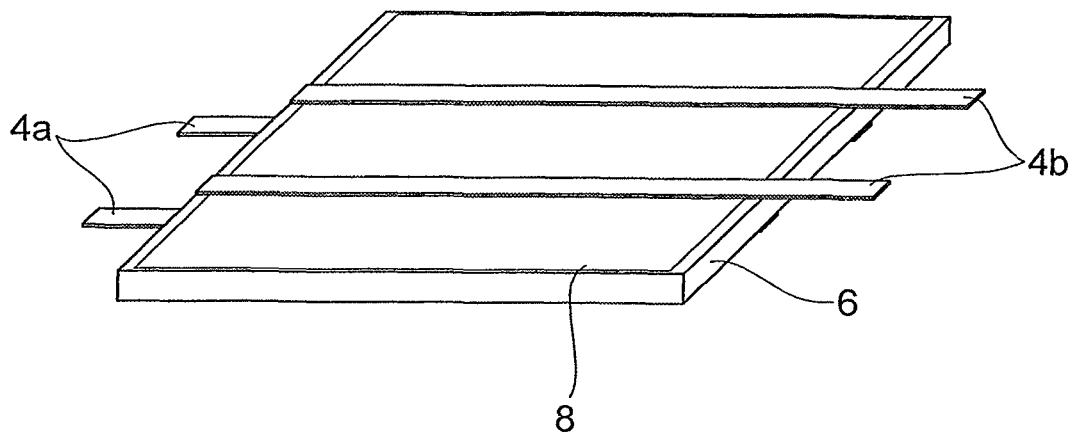

Fig.4
(a)
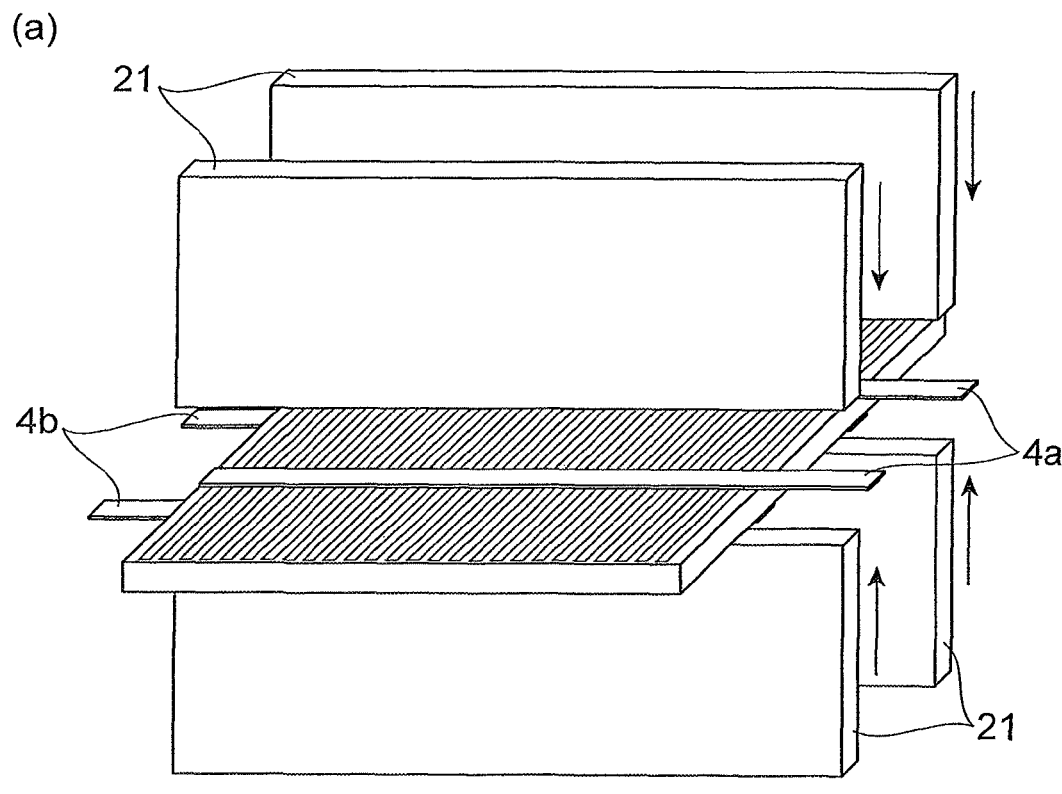
(b)
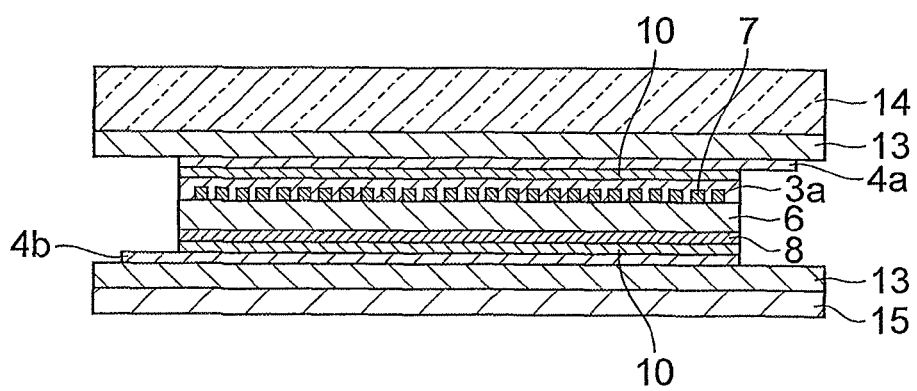

Fig.5
(a)
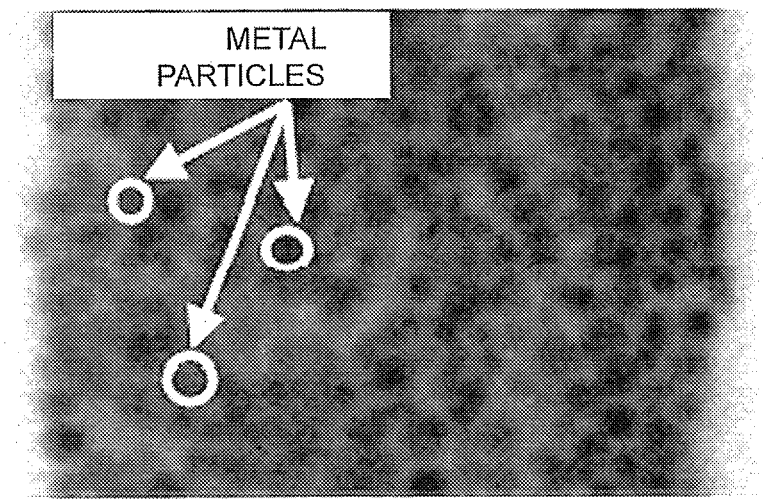
(b)
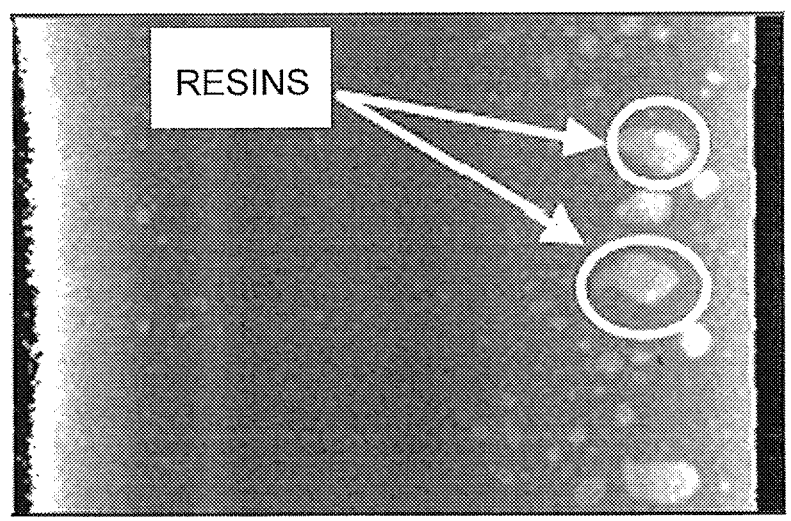

SOLAR CELL MODULE AND METHOD OF MANUFACTURING THEREOF

TECHNICAL FIELD

The present invention relates to a solar cell module and a method of manufacturing thereof.

BACKGROUND ART

As means for solving aggravated global warming or fossil energy depletion, attention is paid on a solar battery cell which is a power generating system using sunlight. A structure in which solar battery cells in which an electrode is formed on a monocrystalline or polycrystalline Si wafer, are connected in series or in parallel to each other through a metal wiring member, has been employed for the current main solar battery cells. In general, solder which shows excellent conductivity and is inexpensive has been used for the connection of the electrodes of the solar battery cells and the metal wiring member (Patent Literature 1). Further, in recent years, in consideration of environmental problems, a method has been known for applying Sn—Ag—Cu solder which does not contain Pb onto a copper wire which is a wiring member, and connecting electrodes of solar battery cells and the wiring member by performing heating to a temperature equal to or higher than a melting temperature of the solder (Patent Literature 1 and 2).

In addition, as a method of connecting the electrodes of the solar battery cells and the wiring members to each other, a method of using a conductive adhesive composition capable of electrical connection by heating at a lower temperature has been proposed (Patent Literature 3). This conductive adhesive composition is a composition obtained by mixing and dispersing of metal particles which are typified by silver particles in a thermosetting resin, and the electrical connection is expressed by physical contact with these metal particles to the electrodes of the solar battery cells and the metal wire.

CITATION LIST

Patent Literature

[Patent Literature 1] Japanese Unexamined Patent Application Publication No. 2002-263880
[Patent Literature 2] Japanese Unexamined Patent Application Publication No. 2004-204256
[Patent Literature 3] Japanese Unexamined Patent Application Publication No. 2005-243935

SUMMARY OF INVENTION

Technical Problem

By the way, at the time of connecting electrodes of solar battery cells and wiring members, in order to prevent decrease of a yield ratio due to occurrence of warping or cracking on the solar battery cells, it is desirable to obtain electrical connection by heating at a lower temperature. Further, in a solar cell module after being connected, it is more desirable to have connection properties of the wiring members and the electrodes (hereinafter, simply referred to as "connection properties") even after a high temperature and high humidity test (85° C./85% RH).

An object of the present invention is to provide a method of manufacturing a solar cell module, the method of obtaining electrical connection by heating at a lower temperature and showing excellent connection properties even after a high temperature and high humidity test by the obtained solar cell module, and a solar cell module manufactured by the manufacturing method.

Solution to Problem

There is provided a method of manufacturing a solar cell module including: a step (A) of applying a conductive adhesive composition comprising conductive particles (a) having metal, a thermosetting resin (b), and a flux activator (c) onto electrodes of solar battery cells (hereinafter, also referred to as a "step (A)"); a step (B) of disposing wiring members so as to face electrodes of the solar battery cells with the applied conductive adhesive composition interposed therebetween (hereinafter, also referred to as a "step (B)"); a step (C) of heating the solar battery cells with the wiring members obtained in the step (B) (hereinafter, also referred to as a "step (C)"); and a step (D) of laminating sealing resins onto both surfaces of the solar battery cells with the wiring members obtained in the step (C), further laminating protection glass onto a light-receiving surface of the solar battery cell and a protection film onto a rear surface of the solar battery cell, and performing heating (hereinafter, also referred to as a "step (D)"), in which a melting point of the metal in the conductive particles (a) is equal to or lower than the heating temperature in the step (C).

According to the method of manufacturing a solar cell module, electrical connection is obtained by heating at a lower temperature and the obtained solar cell module shows excellent connection properties even after a high temperature and high humidity test.

In addition, in the present specification, the "melting point" refers to a value measured by Differential Scanning Calorimetry (DSC), for example.

It is preferable that the metal of the conductive particles (a) contain at least one component selected from bismuth, indium, tin, and zinc. Accordingly, it is possible to decrease the melting point of the conductive particles while maintaining excellent conductivity.

It is preferable that the thermosetting resin (b) contain an epoxy resin or a (meth)acrylic resin, from a viewpoint of obtaining excellent connection stability.

It is preferable that the flux activator (c) be a compound having a carboxyl group in a molecule, from a viewpoint of showing excellent flux activity.

In addition, according to the present invention, there is provided a solar cell module manufactured by the manufacturing method described above. Since the solar cell module of the present invention is manufactured by the manufacturing method described above, excellent connection properties are shown even after the high temperature and high humidity test.

Advantageous Effects of Invention

According to the present invention, it is possible to provide a method of manufacturing a solar cell module, the method of obtaining electrical connection by heating at a lower temperature and showing excellent connection properties even after a high temperature and high humidity test by the obtained solar cell module, and a solar cell module manufactured by the manufacturing method.

BRIEF DESCRIPTION OF DRAWINGS

FIG. 2 is a view for illustrating one embodiment of a method of manufacturing a solar cell module of the embodiment.

FIG. 3 is a view for illustrating one embodiment of a method of manufacturing a solar cell module of the embodiment.

FIG. 4 is a view for illustrating one embodiment of a method of manufacturing a solar cell module of the embodiment.

FIG. 5 is a view showing results obtained by observing fusion states of metal in a conductive adhesive composition between surface electrodes of solar battery cells and wiring members by an X-ray inspection system.

DESCRIPTION OF EMBODIMENTS

Figure 1:
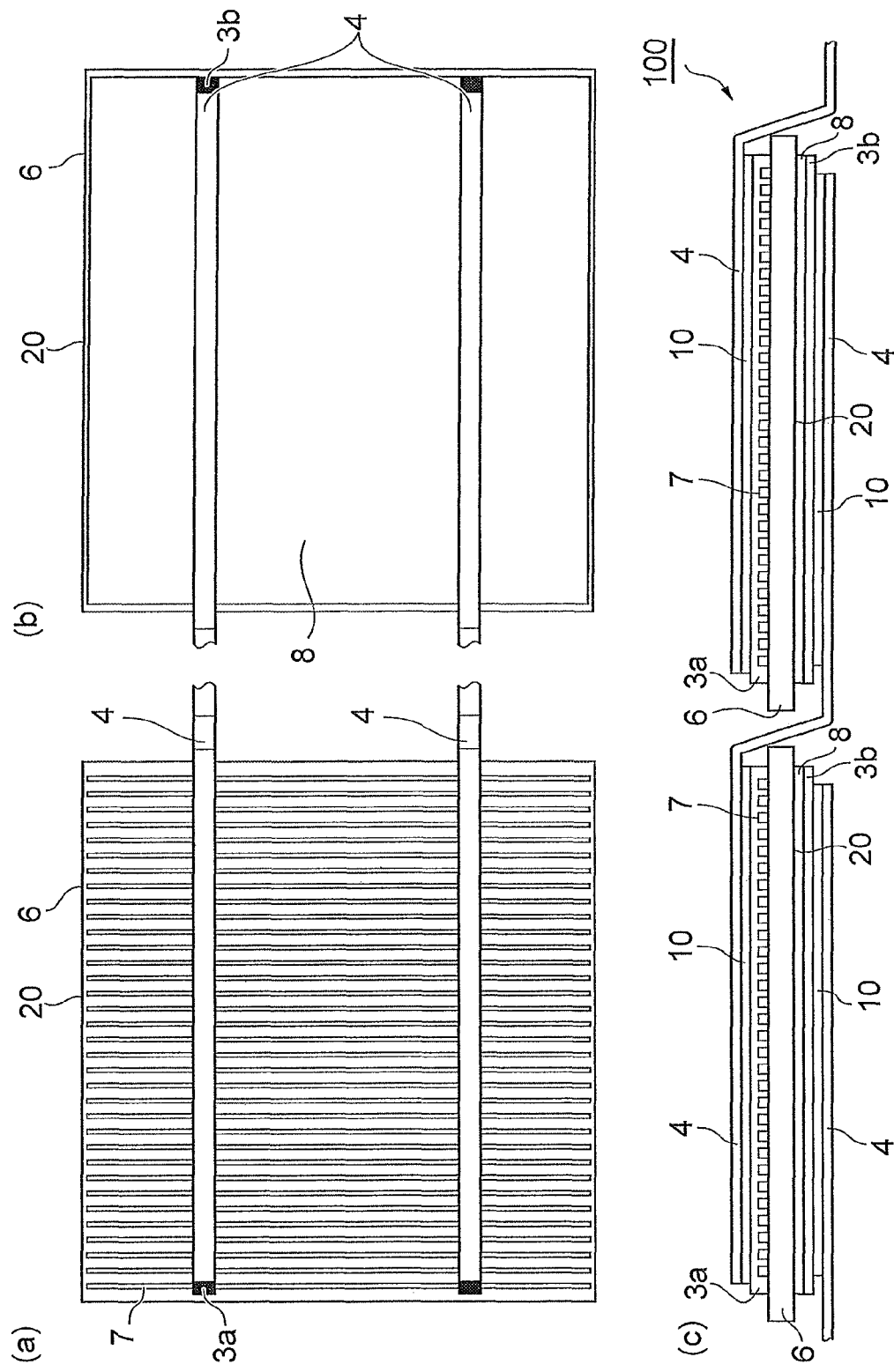
FIG. 1 is a schematic view showing main parts of a solar cell module manufactured by a method of manufacturing a solar cell module of an embodiment.

Hereinafter, preferred embodiments of the present invention will be described in detail with reference to the drawings. In addition, in the drawings, the same reference numerals are given to the same or corresponding parts, and the overlapping description is omitted.

[Method of Manufacturing Solar Cell Module]

A method of manufacturing a solar cell module of the embodiment will be described with reference to the drawings. FIG. 1 is a schematic view showing main parts of a solar cell module manufactured by a method of manufacturing a solar cell module of an embodiment, and shows an outline of a structure in which the plurality of solar battery cells are connected to each other by wires, as an example. FIG. 1(a), FIG. 1(b), and FIG. 1(c) are views showing a solar cell module seen from a front surface side, a rear surface side, and a side surface side, respectively.

As shown in FIGS. 1(a) to 1(c), in a solar cell module 100, a plurality of solar battery cells each in which a grid electrode 7 and surface electrodes (bus electrodes) 3a are formed on a front surface (hereinafter referred to as a "light-receiving surface") side of a solar battery cell 6 and a rear surface electrode 8 and bus electrodes 3b are formed on a rear surface side thereof, are connected to each other by wiring members 4. One, end and the other end of the wiring member 4 are respectively connected to the surface electrodes 3a of the front surface of the solar battery cell and to the bus electrodes 3b in series, through the conductive adhesive composition 10.

FIGS. 2 to 4 are views for illustrating one embodiment of a method of manufacturing a solar cell module of the embodiment. In addition, Steps 1 and 3, Steps 2 and 4, Step 5, and Step 6 in the following descriptions correspond to the step (A), the step (B), the step (C), and the step (D), respectively. In addition, in the following descriptions, for convenience sake, a wiring member on a portion which is connected to the light-receiving surface of the solar battery cell is called a wiring member 4a, and a wiring member on a portion which is connected to the rear surface of the solar battery cell is called a wiring member 4b.

In the manufacturing method of the embodiment, first, as shown in FIG. 2(a), the conductive adhesive composition is applied onto the surface electrode 3a of the solar battery cell 6 using dispense nozzles 12, by a dispensing method (Step 1). The applied conductive adhesive composition is preferable to be liquid from a viewpoint of a coating property. As an applying method of the conductive adhesive composition, other than the dispensing method, methods of the related arts such as a screen printing method or a stamping method can be applied, however, from viewpoints of viscosity of the conductive adhesive composition and workability, the dispensing method is preferable.

An applying amount of the conductive adhesive composition is not particularly limited as long as it is an amount which does not protrude from the surface electrode 3a, and when converting the amount into a unit length, it is preferably 0.001 to 1.0 mg/mm, more preferably 0.005 to 0.9 mg/mm, particularly preferably 0.008 to 0.8 mg/mm, and more particularly preferably 0.01 to 0.5 mg/mm. If the applying amount thereof is less than 0.001 mg/mm, there is a concern that connection reliability of the solar battery cell 6 is degraded. In addition, if the applying amount thereof is more than 1.0 mg/mm, at the time of being left after the applying, there is a concern that the conductive adhesive composition protrudes to the light-receiving surface of the solar battery cell 6 in the vicinity of the surface electrode 3a and becomes a disturbance of light receiving. In addition, the conductive adhesive composition may be applied onto the wiring member, instead of being applied onto the surface electrode.

Next, as shown in FIG. 2(b), the surface electrodes 3a and wiring members 4a are disposed so as to face each other with the applied conductive adhesive composition 10 interposed therebetween (Step 2). As the wiring member used herein, other than a Cu wire or a solder plated wire conventionally used, a wiring member in which metal plating such as Ni, Au, or Ag is formed on an insulating plastic wire can be used. Among them, as the wiring member, the solder-coated tab line is preferably used.

Herein, in Step 2, if the conductive adhesive composition is liquid form, the wiring member can be disposed so as to face the electrodes of the solar battery cells at a room temperature. In addition, in order to prevent position shifting or falling of the wiring member, after disposing the wiring member so as to face the electrodes of the solar battery cells, several portions on the wiring member may be temporally fixed by sticky tape. Examples of the adhesive tape include polyimide tape, vinyl tape, and Scotch tape. And the polyimide tape is preferably used since it has strong heat resistance.

Then, as shown in FIG. 3(a), a step of applying the conductive adhesive composition 10 onto the bus electrodes 3b existing on the rear surface side of the solar battery cell 6 (Step 3), and, as shown in FIG. 3(b), a step of disposing the bus electrodes 3b and the wiring members 4b so as to face each other with the conductive adhesive composition 10 interposed therebetween (Step 4) are performed. Steps 3 and 4 can be performed with the method same as Steps 1 and 2, respectively.

Next, as shown in FIG. 4(a), in a state where the wiring member is disposed on the light receiving surface and the rear surface of the solar battery cell 6, heating is performed using a narrow ceramic heater 21 having the same width and same length as the wiring member (Step 5). By performing this heating, conductive particles in the conductive adhesive composition 10 are melted and fused, and thus, the surface electrodes 3a of the solar battery cell 6 and the wiring members 4a, and the bus electrodes 3b and wiring members 4b are electrically connected directly by the fused metal, respectively.

In addition, as the heating method in Step 5, other than the method using the ceramic heater 21, it is possible to apply methods of the related art such as a hot plate, a heating oven, a ceramic heater, a nozzle heater and the like, however, from a viewpoint of simpler heating, the method of using the ceramic heater 21 is preferable. In addition, the heating can also be simply performed by using a plurality of nozzle heaters which ejects hot air from a nozzle so as to correspond to the width or length of the wiring member. By using the narrow ceramic heater and the nozzle heater, the heat is evenly transmitted and the metal can be sufficiently fused.

A heating temperature of Step 5 is a temperature equal to or higher than a melting point of the metal of the conductive particles (a) of the conductive adhesive composition, which will be described later, and is 140 to 180° C. as a measured value between the electrodes of the solar battery cells and the wiring members. The heating temperature of Step 5 is more preferably 145 to 175° C. and particularly preferably 148 to 170° C. This heating temperature is a value measured using a thermocouple. In a case where the heating temperature is less than 140° C., the conductive particles in the conductive adhesive composition are not melted and the conductivity between the electrodes and the wiring members is decreased. In addition, in a case where the heating temperature is higher than 180° C., heat stress is generated after cooling, and a possibility of damage on the solar battery cell or occurrence of cracks is increased.

In addition, the heating time is preferably 1 to 180 seconds, more preferably 2 to 90 seconds, and particularly preferably 3 to 60 seconds. If the heating time is less than 1 second, since temperature variation at the time of processing the plurality of solar battery cells becomes large, there is a concern that the metal particles are not fused and the conductivity is decreased. Further, in a case where the heating time is longer than 180 seconds, there is a concern that the solar battery cell is warped and yield ratio of manufacturing the solar battery is decreased.

In addition, at the time of the heating step, a weight may be loaded onto the solar battery cell on which the wiring member is disposed, or a pressure treatment may be performed at the same time using the narrow ceramic heater 21. By performing pressurizing, the heat is evenly transmitted, and it is possible to perform the connection of the wiring members and the solar battery cells while preventing distortion of the wiring members. The applying pressure is preferably 0.01 to 2.0 MPa, more preferably 0.02 to 1.5 MPa, and particularly preferably 0.05 to 1.0 MPa. If the applying pressure is low pressure smaller than 0.01 MPa, heat is difficult to be evenly transmitted, and if the applying pressure is greater than 2.0 MPa, there is a concern of occurrence of damage on the solar battery cell or cracks on the solar battery cells.

As described above, in the embodiment, to form the fusion state by melting the conductive particles in the conductive adhesive composition at the time of the heating step is important from viewpoints of electrical properties of the solar battery cells and reliability of the high temperature and high humidity test (85° C./85% RH) (hereinafter, referred to as reliability). As the method of checking the fusion state of the metal, a method of observing the cross section of the solar battery cell after the heating step from the light-receiving surface side, using the X-ray inspection system is used.

After Step 5, as shown in FIG. 4(*b*), a step of laminating sealing resins 13 onto both surfaces of the solar battery cell 6, laminating protection glass (hardened glass) 14 onto the light-receiving surface of the solar battery cell 6, laminating a protection film 15 onto the rear surface of the solar battery cell 6, and performing heating (Step 6) is performed.

As the sealing resins 13, polyvinyl butyral which is an ethylene vinyl acetate copolymer resin (hereinafter, referred to as "EVA") is preferable from viewpoints of transparency, flexibility, cost, and the like. In addition, as the protection glass 14, protection glass, one surface of which is subject to embossing, is preferable. Further, examples of protection film 15 include a fluorine resin film or PET (polyethylene terephthalate or the like), and various composite films are preferably used from viewpoints of weather resistance, a vapor barrier property, an electrical insulating property, and the like. As the composite film, a film in which an electrical insulating film/an adhesive/a film having a vapor barrier property/an adhesive/and a film having weather resistance are laminated in this order from the side of the solar battery cell, can be used. A PET film for electric insulating can be applied as the electric insulating film, an aluminum foil, alumina, and a PET film on which silica is deposited can be applied as the film having the vapor barrier property, a fluorine resin film, a fluorine resin film, a PET film having heat resistance and low oligomer can be applied as the film having weather resistance.

By this heating step of Step 6, curing of the thermosetting resin (B) in the conductive adhesive composition is completed, and physical connection stability between the electrodes and the wiring members is improved. In addition, at the same time, bonding of the sealing resins, the hardened glass, and the protection film is collectively performed. In this heating step of Step 6, a typical hot plate or a heating oven can be used. In addition, a vacuum laminator which is a device generally used for a sealing process of the solar battery cell can be used. After vacuum deaeration of the inside of the chamber, the vacuum laminator can perform heating while constantly adding pressure of atmosphere pressure (0.1 MPa) by releasing only a cover portion. It is preferable to use a Teflon (trade mark) sheet from a viewpoint of preventing contamination.

The heating temperature of Step 6 is not particularly limited as long as it is a temperature not affecting the sealing resins and the back sheet, however, is preferably 100 to 200° C., more preferably 110 to 160° C., and particularly preferably 120 to 150° C. In a case where the heating temperature is less than 100° C., fluidity and bonding property of EVA which is the sealing resin are not sufficient, and in a case where the heating temperature is higher than 160° C., EVA or the back sheet may be degraded by the heat.

In addition, the heating time of Step 6 is preferably 1 to 60 minutes, and more preferably 3 to 50 minutes, and particularly preferably 5 to 30 minutes. If the heating time is less than 1 minute, temperature variation at the time of processing the plurality of solar battery cells becomes large, and there is a concern of a problem that the solar cell module is not sufficiently sealed. Further, if the heating time is less than 1 minute, the curing of the thermosetting resin used in the conductive adhesive composition of the embodiment is not sufficient or the curing of the EVA which is the sealing resin is not sufficient, and thus, there is a concern of a decrease of the reliability. In addition, in a case where the heating time is longer than 60 minutes, since the solar battery cell is warped, there is a concern that the yield ratio for manufacturing the solar battery is decreased.

After that, in order to sufficiently complete the sealing, as the additional heating process, post heating may be performed at 60 to 150 for 1 to 120 minutes using the heating oven.

By the series of Steps (Step 1 to Step 6), it is possible to provide a method of manufacturing a solar cell module which is capable of performing connection at a lower temperature than Sn—Ag—Cu solder of the related art and shows excellent reliability, and it is possible to realize decrease of energy cost, improvement of productivity, and lower cost due to improvement of yield ratio, compared to the step of the related art.

[Conductive Adhesive Composition]

The conductive adhesive composition used in the method of manufacturing solar batteries of the embodiment contains conductive particles (a), a thermosetting resin (b), and a flux activator (c).

As the conductive particles (a), conductive particles which contains metal having a melting point of equal to or lower than a heating temperature of Step (C) can be applied. The melting point of the metal of the conductive particles (a) is preferably equal to or lower than 180° C., more preferably 100 to 180° C., and even more preferably 110 to 180° C.

In Step (C), these conductive particles (a) are melted and fused to directly and electrically connect the electrodes and the wiring members by the fused metal. Examples of such metal include a simple substance or alloy containing at least one kind of component selected from tin (Sn), bismuth (Bi), indium (In), and zinc (Zn). As the conductive particles (a), Sn42-Bi58 solder (melting point of 138° C.), Sn48-In52 solder (melting point of 117° C.), Sn42-Bi57-Ag1 solder (melting point of 139° C.), Sn90-Ag2-Cu0.5Bi7.5 solder (melting point of 189° C.), Sn96-Zn8-Bi3 solder (melting point of 190° C.), Sn91-Zn9 solder (melting point of 197° C.), and the like are preferable since they show a clear solidification behavior after melting. The solidification behavior is a behavior of the metal being cooled and solidified after being melted. Among these, Sn42-Bi58 solder having a low melting point is preferably used. Those are used as one kind, or in combination of two or more kinds.

An average particle size of the conductive particles (a) is not particularly limited, however, is preferably 0.1 to 100 μm. If the average particle size thereof is less than 0.1 μm, the viscosity of the conductive adhesive composition tends to be increased, and the workability tends to be decreased. In addition, if the average particle size of the conductive particles exceeds 100 μm, printing performance and connection reliability tend to be degraded. The printing performance means shape retention force at the time of applying (printing) the conductive adhesive composition, and it is preferable to retain the printed shape after the printing. From a viewpoint of obtaining the even more excellent printing performance and workability of this conductive adhesive composition, the average particle size thereof is more preferably 1.0 to 50 μm. In addition, from a viewpoint of further improving preservation stability of the conductive adhesive composition and mounting reliability of a cured product, the average particle size thereof is particularly preferably 5.0 to 30 μm. Herein, the average particle size is a value measured by a laser diffraction or scattering method (Kamioka Mining Test Method No. 2).

Other than the particles constituted of only the metal, the conductive particles (a) may be conductive particles obtained by coating surfaces of particles consisting of solid-state materials other than metal such as ceramics, silica, and resin materials, or may be a mixture thereof. Examples of such conductive particles include a resin core solder ball.

Regarding content of the conductive particles (a), content of the metal of the conductive particles is preferably 5 to 95% by mass with respect to the total amount of the conductive adhesive composition. In a case where the content of the metal is less than 5% by mass, the conductivity of the cured product of the conductive adhesive composition is degraded. On the other hand, if the content of the metal exceeds 95% by mass, the viscosity of the conductive adhesive composition is increased and the workability is decreased. In addition, since the adhesive components in the conductive adhesive composition are relatively decreased, the mounting reliability of the cured product is decreased.

The "adhesive components" used herein means components other than the conductive particles in the conductive adhesive composition. From a viewpoint of improvement of the workability and the conductivity, the content of the metal of this conductive particles (a) with respect to the total amount of conductive adhesive composition is more preferably 10 to 90% by mass, and from a viewpoint of improving the connection reliability of the cured product, the content thereof is even more preferably 15 to 85% by mass, and particularly preferably 50 to 85% by mass.

In addition, conductive particles (a') containing metal having a melting point of higher than 220° C. may be used with the conductive particles (a). An example of such metal having a melting point of higher than 220° C. includes a simple substance or alloy containing one kind of component selected from Pt, Au, Ag, Cu, Ni, Pd, Al, and the like, and in more detail, the examples thereof include Au powder, Ag powder, Cu powder, Ag-plated Cu powder. As a commercially available product, "MA05K" (product name, manufactured by Hitachi Chemical Co., Ltd.) which is silver-plated copper powder can be purchased.

In a case of using the conductive particles (a') consisting of metal having the melting point of higher than 220° C. with the conductive particles (a), a combination ratio thereof is preferably in a range where (a): (a') is 99:1 to 50:50 by weight ratio, and more preferably in a range where (a): (a') is 99:1 to 60:40.

A thermosetting resin (b) performs an act of bonding electrodes and the wiring members which are adherends, and functions as a binder component which bonds the conductive particles in the conductive adhesive composition and a filler which is added if necessary. Examples of such a thermosetting resin include a thermosetting organic polymer compound such as an epoxy resin, a (meth)acrylic resin, a maleimide resin, and a cyanate resin, and a precursor thereof. Herein, the (meth)acrylic resin denotes a methacrylic resin and an acrylic resin. Among these, the (meth)acrylic resin and the epoxy resin are preferable. These thermosetting resins are excellent in heat resistance and the adhesiveness, and also, since the resins can be used in a liquid form if they are dissolved or dispersed in an organic solvent if necessary, they are also excellent in workability. The thermosetting resin described above is used alone as one kind, or in combination of two or more kinds.

The (meth)acrylic resin is configured from the compound having polymerizable carbon-carbon double bond. Examples of the compound include a monoacrylate compound, a monomethacrylate compound, a diacrylate compound, and a dimethacrylate compound.

Examples of the monoacrylate compound include methyl acrylate, ethyl acrylate, propyl acrylate, isopropyl acrylate, n-butyl acrylate, isobutyl acrylate, t-butyl acrylate, amyl acrylate, isoamyl acrylate, hexyl acrylate, heptyl acrylate, octyl acrylate, 2-ethylhexyl acrylate, nonyl acrylate, decyl acrylate, isodecyl acrylate, lauryl acrylate, tridecyl acrylate, hexadecyl acrylate, stearyl acrylate, isostearyl acrylate, cyclohexyl acrylate, isobornyl acrylate, diethylene glycol acrylate, polyethylene glycol acrylate, polypropylene glycol acrylate, 2-methoxyethyl acrylate, 2-ethoxyethyl acrylate, 2-butoxyethyl acrylate, methoxy diethylene glycol acrylate, methoxy polyethylene glycol acrylate, dicyclopentenyloxyethyl acrylate, 2-phenoxyethyl acrylate, phenoxy diethylene glycol acrylate, phenoxy polyethylene glycol acrylate, 2-benzoyloxyethyl acrylate, 2-hydroxy-3-phenoxypropyl acrylate, benzyl acrylate, 2-cyanoethyl acrylate, γ-acryloxyethyltrimethoxysilane, glycidyl acrylate, tetrahydrofurfuryl acrylate, dimethylaminoethyl acrylate, diethylaminoethyl acrylate, acryloxyethyl phosphate, and acryloxyethylphenyl acid phosphate.

Examples of the monomethacrylate compound include methyl methacrylate, ethyl methacrylate, propyl methacrylate, isopropyl methacrylate, n-butyl methacrylate, isobutyl methacrylate, t-butyl methacrylate, amyl methacrylate, isoamyl methacrylate, hexyl methacrylate, heptyl methacrylate, octyl methacrylate, 2-ethylhexyl methacrylate, nonyl methacrylate, decyl methacrylate, iso-decyl methacrylate, lauryl methacrylate, tridecyl methacrylate, hexadecyl methacrylate, stearyl methacrylate, isostearyl methacrylate, cyclohexyl methacrylate, isobornyl methacrylate, diethylene glycol methacrylate, polyethylene glycol methacrylate, polypropylene glycol methacrylate, 2-methoxyethyl methacrylate, 2-ethoxyethyl methacrylate, 2-butoxyethyl methacrylate, methoxy diethylene glycol methacrylate, methoxy polyethylene glycol methacrylate, dicyclopentenyloxyethyl methacrylate, 2-phenoxyethyl methacrylate, phenoxydiethylene glycol methacrylate, phenoxypolyethylene glycol methacrylate, 2-benzoyloxyethyl methacrylate, 2-hydroxy-3-phenoxypropyl methacrylate, benzyl methacrylate, 2-cyanoethyl methacrylate, γ-methacryloxyethyltrimethoxysilane, glycidyl methacrylate, tetrahydrofurfuryl methacrylate, dimethylaminoethyl methacrylate, diethylaminoethyl methacrylate, methacryloxyethyl phosphate, and methacryloxyethylphenyl acid phosphate.

Examples of the diacrylate compound include ethylene glycol diacrylate, 1,4-butanediol diacrylate, 1,6-hexanediol diacrylate, 1,9-nonane diol diacrylate, 1,3-butanediol diacrylate, neopentyl glycol diacrylate, diethylene glycol diacrylate, triethylene glycol diacrylate, tetraethylene glycol diacrylate, polyethylene glycol diacrylate, tripropylene glycol diacrylate, polypropylene glycol diacrylate, a resultant of reaction between 1 mole of bisphenol A, bisphenol F, or bisphenol AD and 2 moles of glycidyl acrylate, diacrylate of a polyethylene oxide adduct of bisphenol A, bisphenol F, or bisphenol AD, diacrylate of a polypropylene oxide adduct of bisphenol A, bisphenol F, or bisphenol AD, bis(acryloxypropyl)polydimethylsiloxane, and a bis(acryloxypropyl) methylsiloxane-dimethylsiloxane copolymer.

Examples of the dimethacrylate compound include ethylene glycol dimethacrylate, 1,4-butanediol dimethacrylate, 1,6-hexanediol dimethacrylate, 1,9-nonanediol dimethacrylate, 1,3-butanediol dimethacrylate, neopentyl glycol dimethacrylate, diethylene glycol dimethacrylate, triethylene glycol dimethacrylate, tetraethylene glycol dimethacrylate, polyethylene glycol dimethacrylate, tripropylene glycol dimethacrylate, polypropylene glycol dimethacrylate, a resultant of reaction between 1 mole of bisphenol A, bisphenol F, or bisphenol AD, and 2 moles of glycidyl methacrylate, dimethacrylate of a polyethylene oxide adduct of bisphenol A, bisphenol F, or bisphenol AD, a polypropylene oxide adduct of bisphenol F or bisphenol AD, bis(methacryloxypropyl)polydimethylsiloxane, and a bis(methacryloxypropyl)methylsiloxane-dimethylsiloxane copolymer.

These compounds are used alone as one kind, or in combination of two or more kinds. In addition, when containing the (meth)acrylic resin as the thermosetting resin, these compound may be used after performing polymerization in advance, or the compounds may be mixed with the conductive particles (a) and the flux activator (c) and polymerization may be performed at the same time as the mixing.

When polymerizing these compounds and synthesizing the (meth)acrylic resin and the maleimide resin, a radical polymerization initiator is preferably contained. From a viewpoint of efficiently suppressing voids, organic peroxide is preferable for the radical polymerization initiator. In addition, from a viewpoint of improving curing property and viscosity stability of the conductive adhesive composition, a decomposition temperature of the organic peroxide is preferably 70 to 170° C.

Examples of the radical polymerization initiator include 1,1,3,3,-tetramethylbutylperoxy-2-ethylhexanoate, 1,1-bis(t-butylperoxy)cyclohexane, 1,1-bis(t-butylperoxy)cyclododecane, di-t-butylperoxy isophthalate, t-butylperoxy benzoate, dicumyl peroxide, t-butylcumyl peroxide, 2,5-dimethyl-2,5-di(t-butylperoxy)hexane, 2,5-dimethyl-2,5-di(t-butylperoxy)-3-hexyne, and cumene hydroperoxide. These may be used alone as one kind or in combination of two or more kinds.

The radical polymerization initiator is preferably 0.01 to 20% by mass, more preferably 0.1 to 10% by mass, and even more preferably 0.5 to 5% by mass, with respect to the total amount of the adhesive component.

A commercially available resin can be used for the acrylic resin. Specific examples thereof include FINEDIC A-261 (product name, manufactured by DIC Corporation), FINEDIC A-229-30 (product name, manufactured by DIC Corporation), and the like.

The epoxy resin is not particularly limited as long as it is a compound having two or more epoxy groups in one molecule thereof, and well-known compounds can be used. Examples of such epoxy resin include epoxy resins derived from bisphenol A, bisphenol F, and bisphenol AD, and epichlorohydrin.

A commercially available product can be used for the epoxy resin. Specific examples thereof include AER-X8501 (product name, manufactured by Asahi Kasei Corporation), R-301 (product name, manufactured by Japan Epoxy Resin Co., Ltd.), and YL-980 (product name, manufactured by Japan Epoxy Resin Co., Ltd.) which are bisphenol A-type epoxy resins, YDF-170 (product name, manufactured by Tohto Kasei Co., Ltd.) and YL-983 (product name, manufactured by Japan Epoxy Resin Co., Ltd.) which are bisphenol F-type epoxy resins, R-1710 (product name, manufactured by Mitsui Petrochemical Industries) which is a bisphenol AD-type epoxy resin, N-730S (product name, manufactured by DIC Corporation) and Quatrex-2010 (product name, manufactured by The Dow Chemical Company) which are phenol novolac type epoxy resins, YDCN-702S (product name, manufactured by Tohto Kasei Co., Ltd.) and EOCN-100 (product name, manufactured by NIPPON KAYAKU Co., Ltd.) which are cresol novolac type epoxy resins, EPPN-501 (product name, manufactured by NIPPON KAYAKU Co., Ltd.), TACTIX-742 (product name, manufactured by The Dow Chemical Company), VG-3010 (product name, manufactured by Mitsui Petrochemical Industries), and 1032S (product name, manufactured by Japan Epoxy Resin Co., Ltd.) which are multifunctional epoxy resins, HP-4032 (product name, manufactured by DIC Corporation) which is an epoxy resin having a naphthalene skeleton, EHPE-3150 and CEL-3000 (product names, both manufactured by Daicel Corporation), DME-100 (product name, manufactured by New Japan Chemical Co., Ltd.), and EX-216L (product name, manufactured by Nagase ChemteX Corporation) which are alicyclic epoxy resins, W-100 (product name, manufactured by New Japan Chemical Co., Ltd.) which is an aliphatic epoxy resin, ELM-100 (product name, manufactured by Sumitomo Chemical Co., Ltd.), YH-434L (product name, manufactured by Tohto Kasei Co., Ltd.), TETRAD-X and TETRAD-C (product names, both manufactured by Mitsubishi Gas Chemical Company), and 630 and 630LSD (product names, both manufactured by Japan Epoxy Resin Co., Ltd.) which are amine type epoxy compounds, DENACOL EX-201 (product name, manufactured by Nagase ChemteX Corporation) which is a resorcin type epoxy resin, DENACOL EX-211 (product name, manufactured by Nagase ChemteX Corporation) which is a neopentyl glycol type epoxy resin, DENACOL EX-212 (product name, manufactured by Nagase ChemteX Corporation) which is a hexanediol glycol type epoxy resin, DENACOL EX series (EX-810, 811, 850, 851, 821, 830, 832, 841, and 861 (product names, all manufactured by Nagase ChemteX Corporation)) which are ethylene.propylene glycol type epoxy resins, and E-XL24, and E-XL-3L (product names, all manufactured by Mitsui Chemicals, Inc.) which are epoxy resins represented by the following general formula (I). Among these epoxy resins, the bisphenol A-type epoxy resin, the bisphenol F-type epoxy resin, the bisphenol AD-type epoxy resin, and the amine type epoxy resin having less ionic impurities and excellent reactivity are particularly preferable.

An example of the curing agent is not particularly limited as long as it is conventionally used, and the commercially available product can be purchased. Examples of the commercially available curing agent include H-1 (product name, manufactured by Meiwa Plastic Industries, Ltd.) and VR-9300 (product name, manufactured by Mitsui Toatsu Chemicals, Inc.) which are phenol novolac resins, XL-225 (product name, manufactured by Mitsui Toatsu Chemicals, Inc.) which is a phenol aralkyl resin, MTPC (product name, manufactured by Honshu Chemical Industry Co., Ltd.) which is a p-cresol novolac resin represented by the following General Formula (II), AL-VR-9300 (product name, manufactured by Mitsui Toatsu Chemicals, Inc.) which is an allylated phenol novolac resin, and PP-700-300 (product name, manufactured by Nippon Petrochemicals Co., Ltd.)

[Chemical Formula 1]

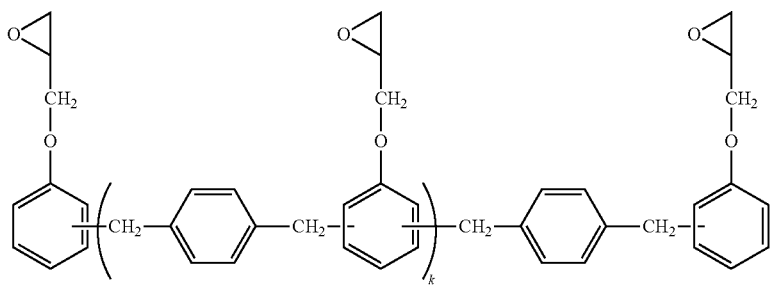

Herein, in Formula (I), k represents an integer from 1 to 5.

The epoxy resins described above are used alone as one kind, or in combination of two or more kinds.

In addition, in a case where the conductive adhesive composition contains the epoxy resins as the thermosetting resin, an epoxy compound having only one epoxy group in one molecule may be further contained as a reactive diluent. Such epoxy compounds are available as commercially available products, and specific examples thereof include PGE (product name, manufactured by NIPPON KAYAKU Co., Ltd.), PP-101 (product name, manufactured by Tohto Kasei Co., Ltd.), ED-502, ED-509, and ED-509S (product names, manufactured by ADEKA CORPORATION), YED-122 (product name, manufactured by Japan Epoxy Resin Co., Ltd.), KBM-403 (product name, manufactured by Shin-Etsu Chemical Co., Ltd.), and TSL-8350, TSL-8355, and TSL-9905 (product names, manufactured by Toshiba Silicones Co., Ltd.). These are used alone as one kind or in combination of two or more kinds.

Content in a case of containing the reactive diluent, may be in a range of not disturbing the effects of the present invention, and is preferably 0.1 to 30% by mass with respect to the total amount of the epoxy resins.

In a case where the conductive adhesive composition contains the epoxy resins, it is further suitable to contain a curing agent or a curing accelerator, for improving a curing property.

which is a specialized phenol resin represented by the following General Formula (III).

[Chemical Formula 2]

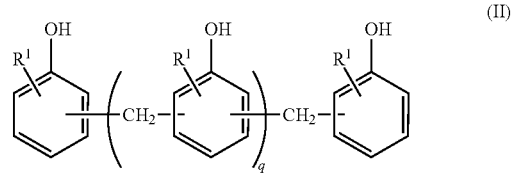

[Chemical Formula 3]

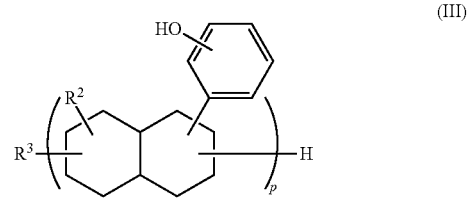

In Formula (II), $R^1$ independently represents a monovalent hydrocarbon group, preferably, a methyl group or an allyl group, and q represents an integer from 1 to 5. In addition, in Formula (III), $R^2$ represents an alkyl group, preferably a methyl group or an ethyl group, $R^3$ represents a hydrogen atom or a monovalent hydrocarbon group, and p represents an integer from 2 to 4.)

The curing agent is preferably contained at a rate to have the total amount of the reaction activity group in the curing agent of equivalent amounts of 0.3 to 1.2, more preferably a rate to have the total amount thereof equivalent amounts of 0.4 to 1.0, and even more preferably a rate to have the total amount thereof equivalent amounts of 0.5 to 1.0, with respect to the equivalent amount of 1.0 of the epoxy group of the epoxy resin. If the amount of the reaction activity group is less than an equivalent amount of 0.2, reflow crack resistance of the adhesive components tends to be decreased, and if the amount thereof exceeds the equivalent amount of 1.2, the viscosity of the adhesive components tends to be increased and the workability tends to be decreased. The reaction activity group is a substituted group having reaction activity with the epoxy resin, and examples thereof include a phenolic hydroxy group.

In addition, the curing accelerator is not particularly limited as long as it is used as a curing accelerator of the related art, such as dicyandiamide, and commercially available products can be used. Examples of the commercially available products include ADH, PDH, and SDH (product names, all manufactured by JAPAN HYDRAZINE COMPANY, INC.) which are dibasic acid dihydrazide represented by the following General Formula (IV), and NOVACURE (product name, manufactured by Asahi Kasei Corporation) which is a microcapsule type curing agent consisting of a resultant of reaction between epoxy resins and amine compounds. These curing accelerators are used alone as one kind or in combination of two or more kinds.

[Chemical Formula 4]

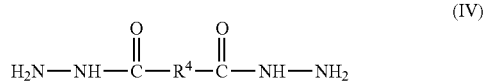

(IV)

In Formula (IV), $R^4$ represents divalent aromatic group or a linear or branched alkylene group having 1 to 12 carbon atoms, preferably a m-phenylene group or a p-phenylene group.

The curing accelerator is preferably 0.01 to 90 parts by mass, more preferably 0.1 to 50 parts by mass, and even more preferably 0.2 to 45 parts by mass, with respect to 100 parts by mass of the epoxy resin. If the combination rate of the curing accelerator is less than 0.01 parts by mass, the curing property tends to be decreased, and if the combination rate thereof exceeds 90 parts by mass, the viscosity is increased, and workability at the time of using the conductive adhesive composition tends to be decreased.

In addition to or instead of the examples described above, as the commercially available curing accelerator, EMZ•K, and TPPK (product names, all manufactured by Hokko Chemical Industry Co., Ltd.) which are organic boron salt compounds, DBU, U-CAT 102, 106, 830, 840, and 5002 (product names, all manufactured by San-Apro Ltd.) which are tertiary amines or salts thereof, and CUREZOL, 2PZ-CN, 2P4 MHZ, C17Z, 2PZ-OK, 2PZ-CNS, and C11Z-CNS (product names, all manufactured by Shikoku Chemicals Corporation) which are imidazoles, may be used. Among these, an imidazole-based curing accelerator is preferably used from viewpoints of reaction start temperature and the curing property.

The combination rate of the curing accelerator is preferably 0 to 50 parts by mass, more preferably 1 to 45 parts by mass, and particularly preferably 2 to 40 parts by mass, with respect to 100 parts by mass of the epoxy resin.

In addition, the curing agent and the curing accelerator may be used alone as one kind or in combination of two or more kinds, respectively.

The flux activator (c) shows a function of removing an oxide film formed on the surfaces of the conductive particles (a), and is not particularly limited as long as it is a compound which does not disturb a curing reaction of the thermosetting resin (B), and a well-known compound can be used. Examples of the compounds include a rosin resin, a compound containing a carboxyl group, a phenolic hydroxy group, or an alcoholic hydroxy group in a molecule, dibasic acid having an alkyl group on a side chain such as 2,4-diethyl glutaric acid, 2,2-diethyl glutaric acid, 3-methyl glutaric acid, 2-ethyl-3-propyl glutaric acid, 2,5-diethyl adipic acid. Since excellent flux activity is shown and excellent reactivity with the epoxy resin used as the thermosetting resin (B) is shown, the compound containing a carboxyl group in a molecule is preferable, and containing a carboxyl group and a hydroxy group is more preferable, and aliphatic dihydroxycarboxylic acid is particularly preferable. In detail, a compound represented by the following General Formula (V) or tartaric acid is preferable.

[Chemical Formula 5]

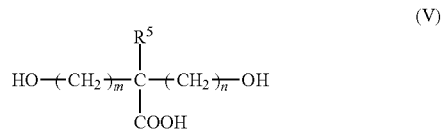

(V)

Herein, in Formula (V), $R^5$ represents an alkyl group having 1 to 5 carbon atoms, and from a viewpoint of further efficiently exhibiting the effects by using the compound represented by General Formula (V), a methyl group, an ethyl group, or a propyl group is preferable. In addition, n and m independently represent an integer from 0 to 5, and from a viewpoint of further efficiently exhibiting the effects by using the compounds represented by General Formula (V), it is preferable that n be 0 and m be 1, or both n and m be 1.

Examples of the compound represented by General Formula (V) include 2,2-bis(hydroxymethyl)propionic acid, 2,2-bis(hydroxymethyl)butyric acid, and 2,2-bis(hydroxymethyl)pentanoic acid.

From a viewpoint of further efficiently exhibiting the effects of the present invention, the content of the flux activator (c) is preferably 0.5 to 20 parts by mass, with respect to 100 parts by mass of the total amount of the conductive particles (a). Further, from viewpoints of the preservation stability and the conductivity, the content thereof is more preferably 0.8 to 15 parts by mass, and even more preferably 1 to 10 parts by mass. In a case where the content of the flux activator (c) is less than 0.5 parts by mass, a melting property of the metal of the conductive particles (A) is decreased, and the conductive is decreased, and in a case where the content thereof exceeds 20 parts by mass, the preservation stability and the printing performance are decreased.

Other than the respective components described above, the conductive adhesive composition may contain a flexibility imparting agent for reaction alleviation, an organic solvent for improving the workability, an adhesiveness improving agent, a wettability improving agent, and defoamer. In addition to these components, various additives may be contained in a range of not disturbing the effects of the present invention.

Examples of the flexibility imparting agent include liquid polybutadiene ("CTBN-1300X31" and "CTBN-1300X9" which are product names manufactured by Ube industries, Ltd. and "NISSO-PB-C-2000" which is a product name manufactured by Nippon Soda Co., Ltd.). The content of the flexibility imparting agent is generally preferably 0 to 500 parts by mass, more preferably 0 to 450 parts by mass, and particularly preferably 0 to 400 parts by mass, with respect to 100 parts by mass of the total amount of the thermosetting resin.

In order to improve adhesiveness, the conductive adhesive composition may contain a coupling agent such as a silane coupling agent or a titanium coupling agent. Examples of the silane coupling agent include "KBM-573" (product name, manufactured by Shin-Etsu Chemical Co., Ltd.). In addition, in order to improve wettability, an anionic surfactant or fluorine surfactant may be contained. Further, as the conductive adhesive composition, silicone oil or the like may be contained as a defoamer. The adhesiveness improving agent, the wettability improving agent, and defoamer are used alone as one kind or in combination of two or more kinds, respectively. 0.1 to 10% by mass of these is preferably contained, 0.2 to 9 parts by mass thereof is more preferably contained, and 0.3 to 8 parts by mass is particularly preferably contained, with respect to the total amounts of the components of the conductive adhesive composition.

In addition, to further improve the workability at the time of manufacturing a paste composition and the coating workability at the time of using it, it is possible to add an organic solvent to the conductive adhesive composition if necessary. As such an organic solvent, an organic solvent having a relatively high boiling point such as butylcellosolve, carbitol, butylcellosolve acetate, carbitol acetate, dipropylene glycol monomethyl ether, ethylene glycol diethyl ether, α-terpineol, and the like. This organic solvent is preferably contained to be 0.001 to 50 parts by mass, more preferably contained to be 0.01 to 40 parts by mass, and particularly preferably contained 0.1 to 30 parts by mass, with respect to 100 parts by mass of the total amounts of the adhesive composition.

The conductive adhesive composition may contain a filler for improving the printing performance. Examples of the filler include polymer particles such as polystyrene, rubber such as acryl, and inorganic particles such as diamond, boron nitride, aluminum nitride, alumina, and silica. These fillers may be used alone as one kind or in combination or two or more kinds.

From a viewpoint of more efficiently exhibiting a fusion property of the conductive particles (a), the combination ratio of the adhesive component with respect to the conductive particles (adhesive component/conductive particles) is preferably 5/95 to 50/50 with respect to the solid content ratio (mass ratio) in the conductive adhesive composition. Further, from viewpoints of adhesiveness, conductivity, and workability, the combination ratio is more preferably 8/92 to 40/60, particularly preferably 10/90 to 30/70. If this combination ratio is less than 5/95, the viscosity of the conductive adhesive composition is increased and thus, the workability is difficult to be secured, or the adhesiveness tends to be decreased. If this combination ratio exceeds 50/50, the conductivity tends to be decreased.

In the present invention, any of the exemplified respective components described above may be combined to each other.

By performing mixing, dissolving, kneading or dispersing of each component described above at one time or at plural times, and heating if necessary, the conductive adhesive composition described above is obtained as a paste-like composition in which each component is evenly dispersed. Examples of a device for dispersing and dissolving used at this time include a well-known stirrer, a Raikai mixer, a triple roller, a planetary mixer, or the like.

By using the conductive adhesive composition described above for the connection of the electrodes of the solar batteries and the wiring members and applying the manufacturing method of the embodiment, it is possible to provide a method of manufacturing solar batteries which shows excellent reliability with curing at a lower temperature, compared to a method of manufacturing solar batteries using Sn—Ag—Cu solder of the related art.

EXAMPLES

Hereinafter, the present invention will be described in more detail with Examples, however, the present invention is not limited to Examples. In addition, the materials used in Examples and Comparative Examples are manufactured in the method described below or purchased.

Combination Example 1

25.2 parts by mass of YDF-170 (bisphenol F-type epoxy resin, epoxy equivalent amount=170, product name, manufactured by Tohto Kasei Co., Ltd.), 1.3 parts by mass of 2PZ-CN (product name of 1-cyanoethyl-2-phenylimidazole, manufactured by Shikoku Chemicals Corporation), and 3.5 parts by mass of BHPA (2,2-bis(hydroxymethyl)propionic acid) were mixed, and were passed through a triple roller three times, to produce an adhesive component of a conductive adhesive composition.

Then, 70 parts by mass of Sn42-Bi58 particles (average particle size of 20 μm, melting point: 138° C.) which are conductive particles were added and mixed with respect to 30 parts by mass of the adhesive component described above. Further, after performing the kneading of the mixture at equal to or less than 500 Pa for 10 minutes by using a Raikai mixer, the defoaming process was further performed at equal to or less than 500 Pa for 10 minutes by using a Raikai mixer under a vacuum state, to obtain a conductive adhesive composition.

Combination Examples 2 to 9

Conductive adhesive compositions were obtained in the same manner as Combination Example 1 described above, except for resin compositions and combination ratios shown in Table 1. In addition, details of materials shown in Table 1 are as follows. Further, the unit of the combination rates of each material in Table 1 is parts by mass. TETRAD-X: amine type epoxy resin, product name, manufactured by Mitsubishi Gas Chemical Company SR-349: bisphenol A diacrylate, product name, manufactured by Sartomer Company Inc.

BHPA: 2,2-bis(hydroxymethyl)propionic acid, product name, manufactured by Tokyo Chemical Industry Co., Ltd.

BHBA: 2,2-bis(hydroxymethyl)butyric acid, manufactured by Tokyo Chemical Industry Co., Ltd.

Sn42-Bi57-Ag1 solder: melting point of 139° C.
Sn96.5-Ag3-Cu0.5 solder: melting point of 217° C.
Sn95-Ag5: melting point of 221° C. to 240° C.
TCG-1: silver powder, melting point of equal to or higher than 960° C., product name, manufactured by Tokuriki Chemical Research Co., Ltd. MA05K: Ag-plated Cu powder, melting point of equal to or higher than 800° C., product name, manufactured by Hitachi Chemical Co., Ltd particles were fused was evaluated as "excellent", and a state where the conductive particles were not fused was evaluated as "not good". In the state where the conductive particles were not fused (non-fused), black granular metal particles were observed in the image taken by the X-ray inspection system as shown in FIG. 5(a). In addition, in the state where the conductive particles were fused, as shown in FIG. 5(b), the black granular metal particles which were seen at the time of the non-fused state were not observed, and the

TABLE 1

| | | Composition (% by mass) | | | | | | | | |
|---|---|---|---|---|---|---|---|---|---|---|
| | | Combination Ex. 1 | Combination Ex. 2 | Combination Ex. 3 | Combination Ex. 4 | Combination Ex. 5 | Combination Ex. 6 | Combination Ex. 7 | Combination Ex. 8 | Combination Ex. 9 |
| Thermosetting resin | YDF-170 | 25.2 | 25.2 | 25.2 | — | 25.2 | 25.2 | 22.7 | 25.7 | 22.7 |
| | TETRAD-X | — | — | — | 25.2 | — | — | — | — | — |
| | SR-349 | — | — | — | — | — | — | 2.5 | — | 2.5 |
| Curing accelerator | 2PZ-CN | 1.3 | 1.3 | 1.3 | 1.3 | 1.3 | 1.3 | 1.3 | 1.3 | 1.3 |
| Flux activator | BHPA | 3.5 | — | 3.5 | 3.5 | — | 3.5 | 3.5 | 3.5 | 3.5 |
| | BHBA | — | 3.5 | — | — | — | — | — | — | — |
| Conductive particles | Sn42—Bi58 | 70 | 70 | 60 | 70 | 70 | — | — | — | 70 |
| | Sn96.5—Ag3—Cu0.5 | — | — | — | — | — | 70 | — | — | — |
| | TCG-1 | — | — | — | — | — | — | 70 | — | — |
| | MA-05K | — | — | 10 | — | — | — | — | — | — |
| | Sn95—Ag5 | — | — | — | — | — | — | — | 70 | — |

Examples 1 to 10 and Comparative Examples 1 to 7

Examples 1 to 10 and Comparative Examples 1 to 7 will be described with reference to FIGS. 2 to 4. The conductive adhesive compositions (Combination Examples 1 to 9) obtained by the compositions shown in Table 1 were applied onto the surface electrodes 3a (material: silver glass paste, 2 mm×125 mm) formed on the light-receiving surfaces of the solar battery cells 6, (125 mm×125 mm, thickness of 210 μm) by using a dispenser (ML-606X, product name, manufactured by Musashi Engineering, Inc.) to have a width of 0.25 mm×a length of 122 mm (FIG. 2(a), Step 1). A solder coated tab line (A-TPS, product name, manufactured by Hitachi Cable, Ltd.) was disposed so as to face the surface electrodes 3a as the wiring members 4a with the conductive adhesive composition interposed therebetween (FIG. 2(b), Step 2). In addition, the weight of the coating amount was measured before and after the coating, and then, conversion into the coating length was performed for unit length. After that, the conductive adhesive compositions were applied in the same manner for the bus electrodes 3b of the rear surface, and the tab lines (wiring members) 4b were disposed (FIGS. 3(a) and 3(b), Steps 3 and 4). Then, using thermal compression device (MB-200WH, product name, manufactured by Nikka Equipment & Engineering Co., Ltd.), heating pressure bonding was performed by setting so as to achieve a predetermined temperature after the predetermined time with pressure of 0.5 MPa (FIG. 4(a), Step 5). The predetermined time and the predetermined temperature are as shown in Tables 2 and 3.

[Evaluation of Metal Fusion State]

The fusion states of the metal in the conductive adhesive compositions between the surface electrodes 3a of the solar battery cells obtained in the steps described above and the wiring members 4a were observed by the X-ray inspection system (MF 160C, product name, manufactured by Hitachi Kenki FineTech Co., Ltd.). A state where the conductive portion where the conductive particles were melted and fused was seen as black shadow of one surface.

[Appearance Evaluation]

The appearance of the obtained solar batteries with the tab line was visually observed and evaluated. A state where the resins flowed to the cells was evaluated as "bleeding" and a state where the resins did not flow to the cells was evaluated as "excellent".

[High Temperature and High Humidity Test]

After that, the sealing resins 13 (SOLAR EVA SC50B, product name, manufactured by Mitsui Chemicals Fabro, Inc.) and the protection glass 14 (200×200×3 mm) were laminated onto the light-receiving surfaces of the surfaces of the solar battery cells, and the sealing resins 13 (SOLAR EVA SC50B, product name, manufactured by Mitsui Chemicals Fabro, Inc.) and the protection film 15 (Kobatech PV KB-L1, product name, manufactured by Kobayashi Co., Ltd.) were laminated onto the rear surfaces thereof, after loading the solar battery cells on the hot plate side of the vacuum laminator (LM-50×50-S, product name, manufactured by NPC Incorporated) so that the protection glass 14 comes in contact therewith, and leaving it for 5 minutes under the reduced pressure of 0.1 MPa, the solar battery cells were heated at 140° C. for 10 minutes in a state of releasing the vacuum state of the vacuum laminator, to manufacture a solar cell module (FIG. 4(b), Step 6).

The IV curve of the obtained solar battery cells was measured using a solar simulator (WXS-1555-10, product name, manufactured by Wacom Electric Co., Ltd., AM: 1.5G). In addition, after leaving the solar battery cells under the atmosphere with the high temperature and high humidity of 85° C. and 85% for 1500 hours, the IV curve were measured in the same manner. Fill factors (hereinafter, abbreviated as F.F) which show electrical properties of the solar battery were derived from each IV curve, respectively, the change rate of F.F. before leaving it under the atmosphere with a high temperature and high humidity and F.F after leaving under the atmosphere with a high temperature and high humidity [F.F (1500 h)*100/F.F (0 h)] was set to ΔF.F, and this was used as an evaluation index. In addition, generally, if the value of ΔF.F is equal to or more than 90%, it is determined that the connection reliability is excellent, and it is more preferably equal to or more than 95%. The obtained results are shown in Tables 2 and 3.

TABLE 2

| | | Items | | | | | | |
|---|---|---|---|---|---|---|---|---|
| | | Ex. 1 | Ex. 2 | Ex. 3 | Comparative Ex. 1 | Comparative Ex. 2 | Comparative Ex. 3 | Ex. 4 |
| Conductive adhesive composition | | Combination Example 1 | Combination Example 1 | Combination Example 1 | Combination Example 1 | Combination Example 1 | Combination Example 1 | Combination Example 1 |
| Applied amount of the composition (mg/mm) | | 0.3 | 0.3 | 0.3 | 0.3 | 0.3 | 0.3 | 0.005 |
| Heating pressure bonding conditions | Finally achieved temperature (° C.) | 160 | 160 | 140 | 135 | 135 | 200 | 160 |
| | Time (seconds) | 30 | 3 | 30 | 30 | 60 | 30 | 30 |
| | Pressure (MPa) | 0.5 | 0.5 | 0.5 | 0.5 | 0.5 | 0.5 | 0.5 |
| Metal fusion state | | Excellent | Excellent | Excellent | Not good | Not good | Excellent | Excellent |
| Appearance after connection | | Excellent | Excellent | Excellent | Excellent | Excellent | Bleeding | Excellent |
| Δ F.F (%) | | 99.0 | 99.1 | 99.5 | 84.1 | 84.4 | 89.9 | 91.5 |

TABLE 3

| | | Items | | | | |
|---|---|---|---|---|---|---|
| | | Ex. 5 | Ex. 6 | Ex. 7 | Ex. 8 | Comparative Ex. 4 |
| Conductive adhesive composition | | Combination Example 1 | Combination Example 2 | Combination Example 3 | Combination Example 4 | Combination Example 5 |
| Applied amount of the composition (mg/mm) | | 1.5 | 0.3 | 0.3 | 0.3 | 0.3 |
| Heating pressure bonding conditions | Finally achieved temperature (° C.) | 160 | 160 | 160 | 160 | 160 |
| | Time (seconds) | 30 | 30 | 30 | 30 | 30 |
| | Pressure (MPa) | 0.5 | 0.5 | 0.5 | 0.5 | 0.5 |
| Metal fusion state | | Excellent | Excellent | Excellent | Excellent | Not good |
| Appearance after connection | | Bleeding | Excellent | Excellent | Excellent | Excellent |
| Δ F.F (%) | | 98.4 | 99.3 | 99.1 | 99.5 | 80.2 |

| | | Items | | | | |
|---|---|---|---|---|---|---|
| | | Comparative Ex. 5 | Comparative Ex. 6 | Comparative Ex. 7 | Ex. 9 | Ex. 10 |
| Conductive adhesive composition | | Combination Example 6 | Combination Example 7 | Combination Example 8 | Combination Example 9 | Combination Example 1 |
| Applied amount of the composition (mg/mm) | | 0.3 | 0.3 | 0.3 | 0.3 | 0.3 |
| Heating pressure bonding conditions | Finally achieved temperature (° C.) | 160 | 160 | 160 | 160 | 160 |
| | Time (seconds) | 30 | 30 | 30 | 30 | 30 |
| | Pressure (MPa) | 0.5 | 0.5 | 0.5 | 0.5 | No pressure* |
| Metal fusion state | | Not good | Not good | Not good | Excellent | Excellent |
| Appearance after connection | | Excellent | Excellent | Excellent | Excellent | Excellent |
| Δ F.F (%) | | 86.8 | 83.1 | 80.1 | 98.9 | 98.8 |

All of Examples 1 to 10 showed excellent metal fusion states, appearance after connection, and ΔF.F (%). On the other hand, in Comparative Examples 1 and 2 in which the heating pressure bonding temperature is lower than 140° C., the metal fusion states were not good, and in Comparative Example 3 in which the heating pressure bonding temperature is higher than 180° C., the bleeding was observed from the appearance after the connection. In Comparative Example 4 in which the flux activator was not contained, and Comparative Examples 5 and 6 in which the conductive particles having the melting point equal to or lower than the heating temperature of Step (C) were used, the appearance was excellent, however, it was found that ΔF.F was decreased and the connection properties was obviously decreased.

Comparative Example 8

After applying a flux activator (Deltalux 533, product name, manufactured by Senju Metal Industry Co., Ltd.) onto the electrodes of the light-receiving surfaces and the rear surfaces of the solar battery cells, Sn96.5-Ag3.0-Cu0.5 solder coated tab line (A-TPS, product name, manufactured by Hitachi Cable, Ltd.) was disposed and was heated on a hot plate to 260° C. to melt the solder coated on the tab line to perform the connection with the surface electrodes, however at the time of rapid cooling after the heating, the solar battery cells were cracked, and thus, the properties of the solar batteries could not be measured.

REFERENCE SIGNS LIST

3a: Surface electrodes, 3b: Bus electrodes, 4, 4a, 4b: Wiring members, 6: Solar battery cell, 7: Grid electrode, 8: Rear surface electrode, 10: Conductive adhesive composition, 12: Dispensing nozzle, 13: Sealing resin, 14: Protection glass, 15: Protection film, 21: Narrow ceramic heater, 100: Solar cell module

The invention claimed is:
1. A method of manufacturing a solar cell module comprising: a step (A) of applying a conductive adhesive composition comprising conductive particles (a) having metal, a thermosetting resin (b), and a flux activator (c) comprising aliphatic dihydroxycarboxylic acid onto electrodes of solar battery cells, the aliphatic dihydroxycarboxylic acid being represented by the following general formula:

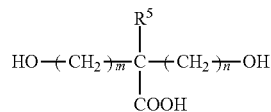

wherein $R^5$ represents an alkyl group having 1 to 5 carbon atoms, and n and m independently represent an integer from 0 to 5;
a step (B) of disposing wiring members so as to face with electrodes of the solar battery cells with the applied conductive adhesive composition interposed therebetween;
a step (C) of heating the solar battery cells with the wiring members obtained in the step (B); and
a step (D) of laminating sealing resins onto both surfaces of the solar battery cells with the wiring members obtained in the step (C), further laminating protection glass onto a light-receiving surface of the solar battery cell and a protection film onto a rear surface of the solar battery cell, and performing heating,
wherein a heating temperature in the step (C) is 140 to 180° C., and a melting point of the metal in the conductive particles (a) is equal to or lower than the heating temperature in the step (C).
2. The method of manufacturing a solar cell module according to claim 1, wherein the metal of the conductive particles (a) contains at least one component selected from bismuth, indium, tin, and zinc.
3. The method of manufacturing a solar cell module according to claim 1, wherein the thermosetting resin (b) contains an epoxy resin or a (meth)acrylic resin.
4. The method of manufacturing a solar cell module according to claim 2, wherein the thermosetting resin (b) contains an epoxy resin or a (meth)acrylic resin.
5. The method of manufacturing a solar cell module according to claim 1, wherein a content of the flux activator (c) is 0.5 to 20 parts by mass, with respect to 100 parts by mass of the total amount of the conductive particles (a).
6. The method of manufacturing a solar cell module according to claim 1, wherein a content of the flux activator (c) is 0.8 to 15 parts by mass, with respect to 100 parts by mass of the total amount of the conductive particles (a).
7. The method of manufacturing a solar cell module according to claim 1, wherein a content of the flux activator (c) is 1 to 10 parts by mass, with respect to 100 parts by mass of the total amount of the conductive particles (a).

* * * * *